(12) United States Patent
Mohondro et al.

(10) Patent No.: US 6,503,693 B1
(45) Date of Patent: Jan. 7, 2003

(54) UV ASSISTED CHEMICAL MODIFICATION OF PHOTORESIST

(75) Inventors: Robert Douglas Mohondro, Sykesville, MD (US); John Scott Hallock, Potomac, MD (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 09/452,878

(22) Filed: Dec. 2, 1999

(51) Int. Cl.[7] .............................. G03C 5/56; G03P 7/00
(52) U.S. Cl. ...................... 430/328; 430/311; 430/315; 430/324; 430/325; 430/330; 216/49; 438/692; 427/337
(58) Field of Search ................................ 430/311, 315, 430/324, 325, 328, 330; 216/49; 438/692; 427/337

(56) References Cited

U.S. PATENT DOCUMENTS

| | | | | |
|---|---|---|---|---|
| 3,873,319 A | * | 3/1975 | Berg | 430/271.1 |
| 4,548,688 A | * | 10/1985 | Matthews | 430/281.1 |
| 5,173,393 A | * | 12/1992 | Sezi et al. | 430/323 |
| 5,275,920 A | * | 1/1994 | Sezi et al. | 430/315 |
| 5,347,040 A | * | 9/1994 | Reiser et al. | 560/139 |
| 6,001,739 A | * | 12/1999 | Konishi | 438/692 |
| 6,057,084 A | | 5/2000 | Mohondro | |

FOREIGN PATENT DOCUMENTS

| | | | | |
|---|---|---|---|---|
| EP | 0425411 A2 | * | 5/1991 | G03F/7/039 |
| JP | 2-224240 | * | 9/1990 | |
| JP | 6-116305 | * | 4/1994 | |

* cited by examiner

*Primary Examiner*—Mark F. Huff
*Assistant Examiner*—Daborah Chacko-Davis

(57) ABSTRACT

A process for altering exposed and developed photoresist features. The photoresist features are exposed to at least one compound that will react with at least one of itself and at least one component of the photoresist. The reaction takes place in the presence of at least one component of the photoresist. The photoresist features are exposed to reaction-initiating energy during at least one time selected from the group consisting of prior to, simultaneous with and subsequent to exposing the photoresist features to the at least one compound.

44 Claims, 12 Drawing Sheets

UV ASSISTED CHEMICAL MODIFICATION OF PHOTORESIST

FIELD OF THE INVENTION

The present invention relates to methods for altering physical and chemical characteristics of photoresist. In particulars the present invention relates to altering physical and chemical characteristics of exposed and developed photoresist features.

BACKGROUND OF THE INVENTION

In the course of manufacturing integrated circuits, semiconductor wafers typically are coated with photoresist. Ultraviolet light is passed through a mask of pre-defined features, both clear and opaque, that are subsequently transferred into the photoresist. The photoresist changes chemically as a result of the UV exposure. These changes typically alter the solubility characteristics of the photoresist. As a result of the alteration of the solubility characteristics, during a developing process, portions of the photoresist may be removed, resulting in a pattern of photoresist features determined by the mask on the wafer.

After defining and developing the pattern of photoresist features, the wafer may then be processed. The processing may be carried out according to a number of processing steps, including etching away areas determined by the pattern, doping impurities, and/or other processes. All or portions of the photoresist features may then be removed. The process of defining a mask of photoresist features and-carrying out processing on the wafer may be repeated until the desired integrated circuit device is fabricated.

The relentless drive towards ever smaller sub-micron feature sizes continues. Smaller feature sizes have resulted in more and faster components being included in a chip of a given size. However, smaller feature sizes have created numerous technical challenges for microlithographic processing.

The technical challenges include developing and implementing materials and processes capable of accurately and reproducibly creating the desired small lithographic structures. One means for doing so includes utilizing ever smaller wavelengths of light to expose the photoresist. Smaller wavelengths have made it possible to resolve smaller features. However, the photoresist needs to be capable of interacting with the light to produce a desired result, such as changing the solubility characteristics of the resist.

Along these lines, traditional I-line resists, based on novolac resins, have functioned well for feature sizes down to about 0.35 $\mu$m. The density of aromatic groups in these resins typically provides adequate plasma etch resistance. However, new photoresist polymers and photoimaging mechanisms have had to be designed in order to overcome problems associated with optical resolution below this level.

Because I-line wavelength light (about 365 nm) results in adverse diffraction effects in resolving features sizes smaller than about 0.35 $\mu$m, light of about 248 nm and about 193 nm, deep UV (DUV) light, is increasingly being used for lithography. The intensity of light at these wavelengths from known sources, however, is much lower than the I-line. Photoresists for use with such wavelengths typically are know as deep UV (DUV) photoresists.

DUV resists based on a "chemical amplification" mechanism have become increasingly popular because of their high sensitivity and demonstrated ability to resolve patterns at about 0.25 $\mu$m and smaller. These systems typically are based on poly(vinyl phenol) polymers or copolymers in which phenol or carboxylic acid groups are partially "blocked" or protected by moieties that can be chemically cleaved to regenerate the phenol or carboxylic acid. Thereby, DUV photoresists provide a solubility difference for development.

Photo-acid generators (PAG's) provide a UV-activated source of strong acid for the catalytic cleavage reaction. It is this catalytic mechanism that is primarily responsible for the high sensitivity of these systems. The polymers, however, are inherently less plasma etch resistant than those of I-line resists due to the lower concentration of aromatic groups in the former. Highly aromatic polymers like those in I-line photoresists are not transparent enough at the DUV exposure wavelengths.

Newer 193 nm resists exhibit the above described problems to an even greater degree. This at least in part results from the lack or near lack of aromatic groups in these polymers, necessitated because of the extremely high absorbance of 193 nm light by aromatic groups.

A new class of 193 nm resists based on cyclo-olefin polymers has been developed to try to address the problem of etch selectivity. However, the etch performance of these newer resists is still inferior to that of I-line resists.

Researchers have expended a great deal of effort in studying the relationships between chemical structure and plasma etch resistance. Except for a handful of post-imaging processes that are described below, most attention has been directed at building etch resistance into the original photoresist polymer. Often, the result of post-imaging processes includes compromising lithographic quality.

Often, photoresists are subject to high temperature processing. Such processing can introduce problems including flow or distortion of features formed of the resist as the resist reaches its glass transition temperature, or basically melts, during exposure to the high temperatures. One method of mitigating the flow or distortion that may occur during high temperature plasma etching of photoresists involves a process known as photostabilization. Photostabilization typically is carried out after the photoresist pattern is formed and prior to etching and/or ion implant.

A preferred method of photoresist stabilization that results in fast stabilization times is disclosed in U.S. Pat. No. 4,548,688, the entire contents of which are hereby incorporated herein by reference. In the preferred method, the photoresist is exposed to UV radiation while its temperature is elevated upon increase in the degree of polymerization due to exposure to the radiation. Additionally, the elevated temperature at any instant during exposure is kept below the flow temperature of the resist at that instant.

Photostabilization has resulted in advantages to the processing of I-line photoresists, and some benefit to deep UV photoresists. The benefits appear to result from crosslinking reactions that take place, which causes, among other things, resist to flow. See Jordhamo and Moreau, *DUV Hardening of DUV Resists*, SPIE, Vol. 2724, pp. 588–600 (1996), the entire contents of which are hereby incorporated by reference.

Although photostabilization of DUV photoresists produces beneficial effects, serious adverse effects exist with the process in the form of shrinkage of features during photostabilization. As described below, shrinkage results in many problems in the subsequent processing and has implications to the final device structure. FIG. 1 illustrates how features formed of photoresist may shrink during processing.

Shrinkage apparently results from multiple causes particularly related to the DUV class of photoresists. Deep UV photoresist resins, typically polymers or copolymers of hydroxy styrene, usually have higher molecular weights and glass transition temperatures than the novolac resins used in I-line photoresists. As a result, the former do not pack as efficiently during the coating process as do the latter. Inefficient packing appears to result in substantial amounts of free volume in the photoresist.

During thermal processing subsequent to feature formation, such as photostabilization, this free volume in the photoresist may be eliminated as the polymer chains are packed more efficiently, resulting in shrinkage. Concurrently, trapped solvents may also be released, further compounding the mass loss. And possibly most importantly, photostabilization, or any thermal processing at sufficiently high temperatures, can cause decomposition of the photo acid generator. Decomposition of the PAG results in formation of strong acid and deprotection of the solubility inhibiting groups on the photoresist polymer. This can result in further mass loss and further shrinkage. It is not uncommon in some deep UV photoresist systems for this shrinkage to approach 20% in one dimension.

Approaches have been proposed to mitigate the problem of shrinkage of photoresist features. According to a process described in co-pending U.S. patent application Ser. No. 08/924,096, for Controlled Amine Poisoning For Reduced Shrinkage Of Features Formed In Photoresist, the entire contents of the disclosure of which is hereby incorporated by reference, the shrinkage of a photoresist under a given set of conditions is measured, or profiled. Then, a lithography mask is designed to take the shrink into account.

Another approach, described in co-pending U.S. patent application Ser. No. 08/943,623, the entire contents of the disclosure of which is hereby incorporated by reference, involves photostabilization in the presence of an amine, such as ammonia gas. The mechanism involves neutralization of the generated photoacid, thereby preventing deprotection and loss of mass from the resist.

According to other efforts to avoid the problems with critical dimension (CD) control and etch selectivity with DUV photoresists, multilayer processes have been designed that involve selective silylation of imaged photoresists followed by oxygen reactive ion etching (RIE) dry developing. Such a process is described by Seeger et al., In *Thin-film imaging: Past, present, prognosis*, IBM JOURNAL OF RESEARCH & DEVELOPMENT, Vol. 41, No. 1/2 (1997). These processes have been primarily developed for I-line type photoresists and include a large number of process steps.

Still other approaches attempt to directly address the problems with CD control and etch selectivity by employing chemical treatments of photoresist patterns. U.S. Pat. No. 5,173,393 describes such a process. These processes rely on uptake and thermal reaction of externally applied chemicals with photoresists. Both the resist polymer and the applied chemical include thermally reactive groups. The photoactive compounds described by U.S. Pat. No. 5,173,393 are not Photo Acid Generators of the type used in chemically amplified deep UV photoresists, but rather o-quinone diazide type compounds utilized in I-line photoresists. U.S. Pat. No. 5,173,393 also relates to the use of applied reactants containing aromatic groups.

SUMMARY OF THE INVENTION

The present invention concerns a process for altering exposed and developed photoresist features. The photoresist features are exposed to at least one compound that will react with at least one of itself and at least one component of the photoresist. The reaction takes place in the presence of at least one component of the photoresist. The photoresist features are exposed to reaction-initiating energy during at least one time selected from the group consisting of prior to, simultaneous with and subsequent to exposing the photoresist features to the at least one compound.

Additionally, the present invention relates to a process for forming a semiconductor device structure. A layer of photoresist is deposited on a semiconductor substrate. A pattern of features is exposed in the photoresist. The photoresist features are developed. Additionally, the photoresist features are exposed to at least one compound that will react with at least one of itself and at least one component of the photoresist, the reaction taking place in the presence of at least one component of the photoresist. Furthermore, the photoresist features are exposed to reaction-initiating energy during at least one of prior to, simultaneous with and subsequent to exposing the photoresist features to the at least one compound.

Furthermore, the present invention provides an altered exposed and developed photoresist that includes a photoresist and at least one compound bonded to or contained within the photoresist.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF THE DRAWINGS

The above-mentioned objects and advantages of the present invention will be more clearly understood when considered in conjunction with the accompanying drawings, in which.

DETAILED DESCRIPTION OF THE INVENTION

The inventors of the present invention have identified a need for processes that can affect physical and chemical properties of photoresist to accomplish certain goals in the processing of photoresist and formation of semiconductor structures. The goals of the present invention may include increasing etch resistance, critical dimension control, and others. By controlling the physical and chemical characteristics of photoresist, the present invention makes it possible to predictably and accurately create a desired pattern of photoresist features having desired sizes. As a result, semiconductor device structures may be formed accurately and predictably on and in semiconductor wafers.

Figure 1:
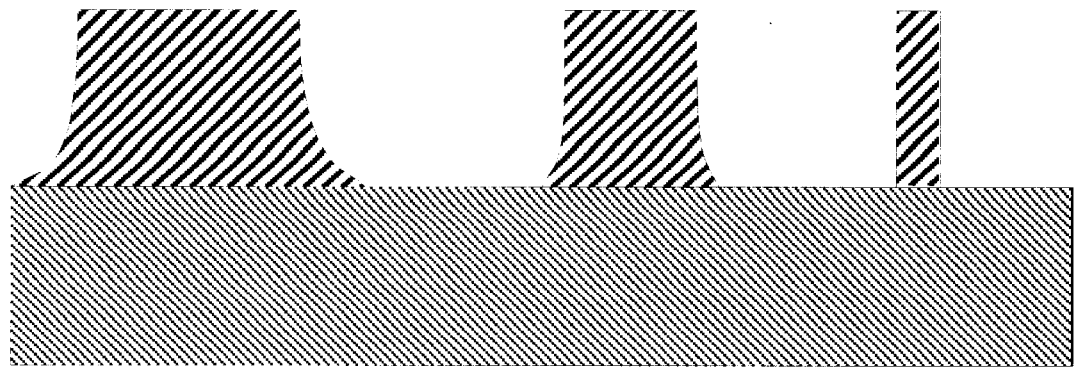
FIG. 1 represents a cross-sectional view of features formed of photoresist on a substrate, wherein the photoresist features have shrunk as a result of processing.
Figure 2:
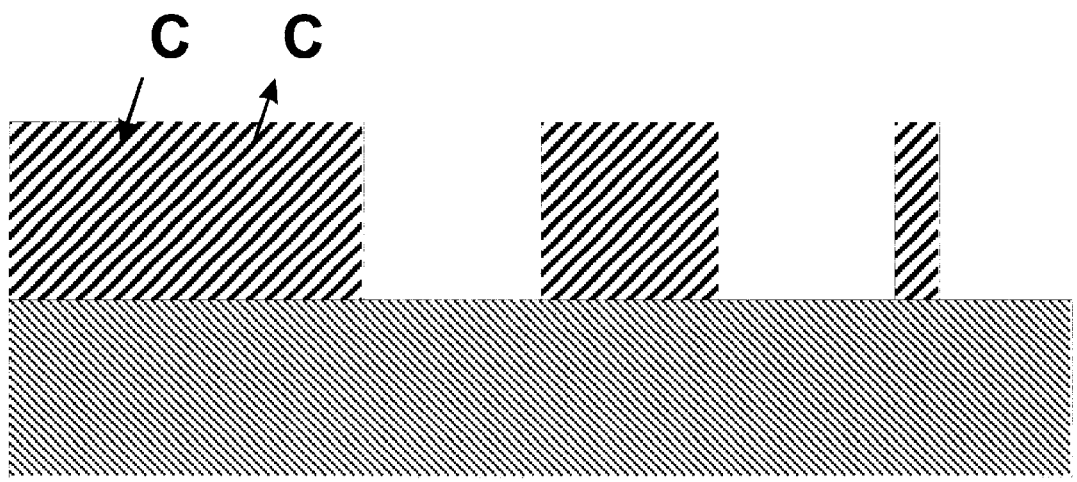
FIG. 2 represents a cross-sectional view of features formed of photoresist on a substrate, wherein according to the present invention chemical(s) have counteracted the shrinkage shown in FIG. 1.

As stated above, FIG. 1 illustrates features formed of photoresist where the features have shrunk during processing. On the other hand, FIG. 2 shows effects of embodiments of the present invention where the shrinkage has been counteracted. As represented by the "C" and arrows, chemical(s) may enter as well as exit the photoresist during processes according to the present invention.

Along these lines, aspects of the present invention permit photoresist to be optimized for lithographic resolution while avoiding compromises associated with trying to incorporate etch-resistant functionality into resist polymers. According to the present invention, photoresist, after development and formation of pattern of photoresist features, with inadequate etch resistance may be treated with a combination of chemicals, such as in a gaseous, vapor, and/or liquid phase, and reaction-initiating energy. The reaction initiating energy can include, among other forms, photons, ions, and/or electrons. The photons could be included in ultraviolet (UV), x-ray, and/or other forms of electromagnetic radiation. The process could also include exposing the photoresist to temperatures above room temperature. The treatment may thus transform the photoresist features in a controlled manner to a desired end critical dimension (CD). Also, the features may be transformed into a highly etch-resistant structure.

The dimensions of the photoresist features after processing according to the present invention may vary, depending upon the goals of the processing. Along these lines, the present invention may result in features have greater, smaller, or substantially the same dimensions as compared to processing without the present invention or prior to carrying out any photostabilization process as described herein.

The present invention also provides methods for increasing plasma etch resistance and/or improving the critical dimension control of imaged and developed photoresist patterns. The present invention accomplishes improvement in the etch resistance and/or the critical dimension control through controlled application of chemicals that and may diffuse into the photoresist polymer. The chemical(s) may be present from the surface of the photoresist and inward. Reaction of the chemical(s) can render the resist thermally stable and/or etch resistant.

The chemicals undergo and/or are caused to undergo reaction(s) either with the photoresist polymer or with themselves. Exposure to the chemicals may be carried out either before, simultaneously with and/or after UV irradiation, e-beam irradiation, ion bombardment and/or exposure to other energy and optionally exposure to heat.

Embodiments of the process of the present invention are designed to enable commercially available DUV photoresists that have been optimized primarily for lithographic quality to be used in subsequent processing steps, such as etching with minimal CD change due to either shrinkage or unsatisfactory etch resistance. By rendering the resist features more robust without compromising lithographic resolution, several advantages may be realized. Furthermore, the present invention can eliminate the need for multi-layer schemes involving a greater number of steps, thus producing large savings in process time and cost. For example, silylation processes include additional steps involved in transferring the image of one resist to another.

In fact, no additional steps may be required by the present invention, assuming the process replaces a conventional hardbake or photostabilization step. Along these lines, the chemical exposure could take place during the photostabilization step in a single tool. Since photostabilization includes exposure to UV radiation, the photostabiliation can provide the exposure to UV radiation. It is not necessary for an additional exposure to UV radiation to be carried out, although such may be the case.

It is believed that increased etch resistance may be imparted to the resist via a combination of pathways. In the simplest case, prevention of or reduction of the loss of material from the photoresist due to acid-catalyzed or thermal deprotection provides for decreased net loss, after carrying out etching.

Alternatively, the mere addition of mass to the photoresist features provides for less net loss after etch, even if the added mass is no more etch resistant than the starting photoresist. Addition of mass may be especially effective if the photoresist has already been photostabilized, with concomitant shrinkage, to form a crosslinked, etch resistant structure to which mass and volume may then be added to return the photoresist features to the original size. The increase in size may be in height and/or width.

Crosslinking of the photoresist polymer may provide for an actual increase in etch resistance due to the effective increase in molecular weight and glass transition temperature (Tg). This mechanism is discussed in Kishimura et al., *Dry etching resistance of resist base polymer and its improvement*, SPIE, Vol. 3049, pages 944–954 (1997), the entire contents of the disclosure of which is hereby incorporated by reference. Crosslinking may be partially responsible for improvements in etch resistance observed from photostabilization or e-beam curing processes.

Crosslinking may also be accomplished in the case of the present invention by adding chemicals which are capable of crosslinking the resist. Finally, the addition of material that inherently has a greater etch resistance than the photoresist polymer may serve to more efficiently increase the etch resistance by decreasing the real etch rate. Regardless of whether mass is added or any other effects, reaction of the at least one compound with itself, the photoresist, and/or material within the photoresist can increase the etch selectivity of the photoresist. This can allow much greater control over the etching process.

The UV, e-beam, and/or ion irradiation of the present invention may provide a key element of the process in that it can provide a mechanism for the externally applied chemical(s) to react either with components of the photoresist or with itself. Processes according to the present invention may be carried out with temperatures above room temperature alone. However, without some type of irradiation, providing energy as a triggering mechanism the process may be less successful. Also, when relying on heat alone, the selection of chemical classes that may undergo reaction may be more limited and have to be more carefully matched to photoresist resin with specific functional groups. For example, U.S. Pat. No. 5,173,393, the entire contents of the disclosure of which are hereby incorporated by reference, describes a process for treating DUV photoresists using, for example, anhydride- or epoxy-functional photoresist polymers that may then react with externally applied aromatic amines. This approach is limited by the requirement to use very specific types of photoresist that are often structurally compromised in the attempt to find balance between lithography and etch resistance. Thus, the approach disclosed in U.S. Pat. No. 5,173,393 may not be general or optimally effective.

According to one embodiment of the present invention, the photoresist is treated with UV, e-beam, ion bombardment and/or thermal energy prior to treatment with chemicals. In cases where liquids capable of plasticizing the photoresist polymer are applied in either vapor or liquid form, the resist features may flow if they have not been crosslinked prior to such UV and/or thermal processes. More importantly, the aforementioned energetic treatment results in chemical changes taking place within the resist that allow the externally applied chemical to undergo reaction.

According to one particular example of this embodiment, UV irradiation effects a decomposition of the PAG to generate strong acid. The acid may then serve as an initiator for, for example, cationic polymerization. According to another example of this embodiment, the formation of radicals may provide sites for free radical initiated polymerizations or other chemical reactions.

Alternatively, the UV irradiation may allow for the possibility of another reaction mechanism. In the case where a resist image is exposed to a vapor phase chemical(s) that is/are capable of photoexcitation, the resist and vaporous atmosphere may be irradiated with UV light to generate the reactive species that may then diffuse into and react with the photoresist. This mechanism is especially helpful in cases where the vapor phase chemical absorbs photoexciting UV light at wavelengths that are also substantially absorbed by the photoresist. Typically, if the chemical(s) is/are first absorbed into the photoresist before UV irradiation, photoexcitation is too inefficient due to the competing absorption of the matrix.

Upon UV irradiation, crosslinking reactions that typically occur in deep UV photoresists upon photostabilization may still be expected to occur to some extent. It is the addition of reactive chemicals to the photoresist structure that can accomplish the additional beneficial effects of this invention described herein. These effects can include increased etch resistance with minimal shrinkage in feature size and/or control over resist feature size.

Processes according to the present invention include exposing photoresist features to at least one compound that will react with at least one of itself and at least one component of the photoresist. The at least one compound typically is a fluid. In other words, the at least one compound may be a gas and/or a liquid. Also, the at least one compound could be a vapor.

Any one or more of a large number of compounds could be utilized in a process according to the present invention. As referred to above, the compound(s) may react with itself, the photoresist, and/or one or more materials in the photoresist. Along these lines, the compound(s) may react with and bond to the photoresist.

Photostabilization may be carried out as part of the invention or separately from the invention. Photostabilization can generate acid, as described herein. The compound(s) may react with the acid. Alternatively or additionally, the acid may catalyze reactions of the compound with itself, the photoresist, and/or material(s) in the photoresist.

Photostabilization may act in other ways to effect the results of the present invention. According to one embodiment, photostabilization generates free radicals in the photoresist the free radicals catalyze reaction of the at least one compound with itself.

The nature of the compounds that may be utilized according to the present invention may result in other reactions. For example, UV radiation or other energy directed at the photoresist and at least one compound may result in photolysis of the at least one compound to form free radicals capable of reacting with the photoresist. According to another embodiment, the at least one compound may undergo bond scission upon irradiation with UV radiation or exposure to other energy. The bond scission may produce radicals. For example, the nature of the at least one compound may be such that the radicals produced by bond scission are phenyl radicals. The phenyl radicals can be capable of coupling with other aromatic rings.

The at least one compound may react with various portions of molecules in the photoresist. For example, the at least one compound may react with phenolic groups within the photoresist. The at least one compound could also react with other portion(s) of the photoresist molecules. For example, the at least one compound could react with an aromatic ring or carboxylic acid groups on the photoresist molecules.

The above description provides some examples of reactions that may take place with the at least one compound. Some examples of compounds that may be utilized according to the present invention include epoxides, vinyl ethers, furans, coumarins, indenes, styrenes, acrylonitriles, acrylates, aryl halides, halosilanes, alkynes, alkenes, cyclic ethers, and sulfur dioxide. Any member of any of these groups may be utilized according to the present invention as long as the selected member results in the desired effects to the photoresist.

If the at least one compound is an acrylate, examples,of acrylates can include methyl methacrylate and phenyl methacrylate. One example of a nitrile that may be used according to the present invention is methacrylonitrile. Additionally, examples of alkenes and alkynes that may be utilized according to the present invention are ethylene, butadiene, acetylene, and indene.

In come cases, the at least one compound may be selected based upon the presence of certain groups on the compound. For example, the at least one compound can include vinyl monomers. The vinyl monomers can include vinyl ether monomers. According to some embodiments, the vinyl monomers include aromatic groups. Another quality that the vinyl monomers may have is that the vinyl monomers may be highly volatile or gaseous. Examples of compounds that include vinyl monomers are indene, 2,3-benzofuran, phenyl vinyl ether, methyl vinyl ether, and 2,3-dihydrofuran.

Other groups that the at least one compound may include are epoxy-functional monomers. According to some embodiments, the epoxy-functional monomers are highly volatile or gaseous. Examples of epoxy-functional monomers include (2,3-epoxypropyl)benzene, ethylene oxide, and propylene oxide.

The at least one compound may include a variety of monomers. The monomers can include acrylic monomers, styrene monomers, and/or acrylonitrile monomers.

In broader terms, some embodiments of the at least one compound may include photolabile bonds. Also, the at least one compound may include at least one etch-resistant structure. The etch-resistant structures may include an aromatic ring, cyclic or multicyclic hydrocarbons, such as norbornyl groups.

According to more specific examples, the at least one compound may be an aryl halide. Examples of aryl halides can include iodobenzene, bromobenzene, and chlorobenzene.

Furthermore, the at least one compound may include at least one chlorosilane. Examples of chlorosilanes include dimethylphenylchlorosilane.

Still further, the at least one compound may include an alkyne group and/or at least one aromatic ring. Alkynes can include phenylacetylene and butadiyne.

The inventors have anticipated a broad variety of chemicals and reaction mechanisms capable of, for example, improving CD control and decreasing etch loss in deep UV photoresists. Any UV, e-beam, or ion bombardment-assisted process capable of diffusing chemicals into developed photoresist features and then causing them to undergo reaction in such a way as to render them incapable of diffusing back out of the photoresist may be used. Under conditions expected to be encountered in subsequent process steps, especially plasma etching, this process is capable of reducing shrinkage and, hence, improving CD control and also reducing the net feature loss during plasma etching by increasing the resistance of the photoresist material to the reactive etch chemistries. By way of example only, several chemical processes capable of effecting the desired results are described below.

Generally, the present invention includes treating exposed and developed photoresist features with at least one compound. The total time that the photoresist features are exposed to the at least one compound may be about 5 seconds to about 1 hour. Of course, any time necessary to achieve the desired effects may be utilized.

The photoresist features and at least one compound are exposed to energy in the form of UV radiation, e-beam, or ion bombardment or other energy. The UV or other energy may be applied continuously or intermittently. The total time that the photoresist features and the at least one compound are exposed to ultraviolet radiation may be about 5 seconds to about 5 minutes. The UV radiation or other form of energy may have a constant or variable intensity typically ranging between about 10 mW and about 1 W.

During at least one period before, during and/or after the UV or other energy exposure, the photoresist features and at least one compound may also be exposed to temperatures above room temperature. Just as with the UV or other energy exposure, the elevated temperature exposure may be continuous or intermittent. Typically, the photoresist features are exposed to temperatures above about 20° C. to about 250° C. More typically, the temperature is above about 20° C. to about 200° C. Whether an embodiment utilizes continuous or intermittent exposure to elevated temperatures, the total time that the photoresist features and at least one compound are exposed to elevated temperatures is typically about 5 seconds to about 1 hour.

According to one embodiment, at least one chemical capable of irreversibly scavenging the photo-generated acid below the deprotection temperature of the photoresist may be used. This type of chemistry is analogous to the use of ammonia and other amines, which is the subject of U.S. patent application Ser. No. 08/943,623, filed Oct. 3, 1997, the entire contents of the disclosure of which is hereby incorporated by reference, but does not suffer from the thermal stability problems of the latter which are caused by the reversibility of the acid-base reaction between an amine and an acid.

One example of a chemical appropriate for the purposes of this invention is acetylene. Alkynes in general may undergo facile addition reactions with trifluoromethanesulfonic acid at low temperatures. See J. AM. CHEM. SOC., 96(4), 1100 (1974). The reaction is as shown below:

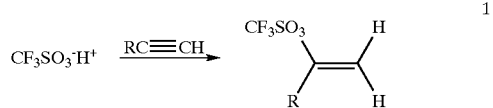

Trifluoromethanesulfonic acid is representative of photoacids resulting from photoreaction of Photo Acid Generators. Acetylene is a very small molecule with high diffusivity into many polymers, and further provides an advantage in being a gas at room temperature. Not only is the acid proton irreversibly bound in this process, thereby preventing acid-catalyzed deprotection reaction and minimizing feature size loss due to shrinkage, but mass may also be added to the resist in the form of the acetylene addition product. Acetylene and other alkynes are anticipated to react to form compositions that are highly etch resistant due to the high carbon:hydrogen ratio of these compounds.

Carrying out another process according to the present invention, any number of chemical reagents capable of participating in UV-assisted addition to the photoresist polymer may be used. Addition is here understood to mean chemical reaction with and attachment to the polymer. A special case of this process is where the chemical reagent may react with more than one site on the polymer, resulting in crosslinking and, thus, further enhancing etch resistance.

In either case, mass is added to the photoresist structure. The added mass can also result in reduction of structure loss after plasma etching. Swelling can include net reduction of shrinkage as well as situations where the photoresist features have dimensions greater than those prior to any processing that results in any shrinkage.

The photoresist features may swell to a size greater than the size as formed as a result of the present invention with or without adding mass. Along these lines, after carrying out the process, at least one physical dimension of the photoresist features is greater than the corresponding physical dimension after developing of the photoresist features. For example, the photoresist features may swell in at least one of at least one direction parallel to a surface that the photoresist is deposited on and a direction perpendicular to the surface that the photoresist is deposited on.

The swelling of the photoresist can have the opposite effect on open spaces within the photoresist features, between photoresist features and/or any spaces adjacent the photoresist features. For example, if the photoresist swells, vias surrounded by the photoresist features will shrink.

Along these lines, controlled swelling is the counter to shrinkage, particularly when the surface area of the wafer remains nearly completely covered with resist and the imaged areas are actually holes in the resist. These "holes" are most commonly referred to as contacts or vias. These "hole" images provide means for connecting one layer to another by etching through the exposed material under the resist through the holes in the resist until the layer beneath the material being etch is reached.

By eliminating the natural tendency for resists to "shrink" by either maintaining or controllably swelling the resist, the contacts or vias will actually maintain their original shape and size or get smaller. This is to say they will become smaller in diameter and in grow in height. Since contacts and vias are round holes, the swelling, much like the shrinkage, is generally symmetrical.

Additionally, the aforementioned line or "area" features may also be controllably swelled in height, length and width. These features may be "preshrunk" and then swelled back to their original size or larger depending on the applied process treatment. However, in both instances the process can be parametrically controlled and the desired features or holes can be processed to a given dimension.

Figure 18:
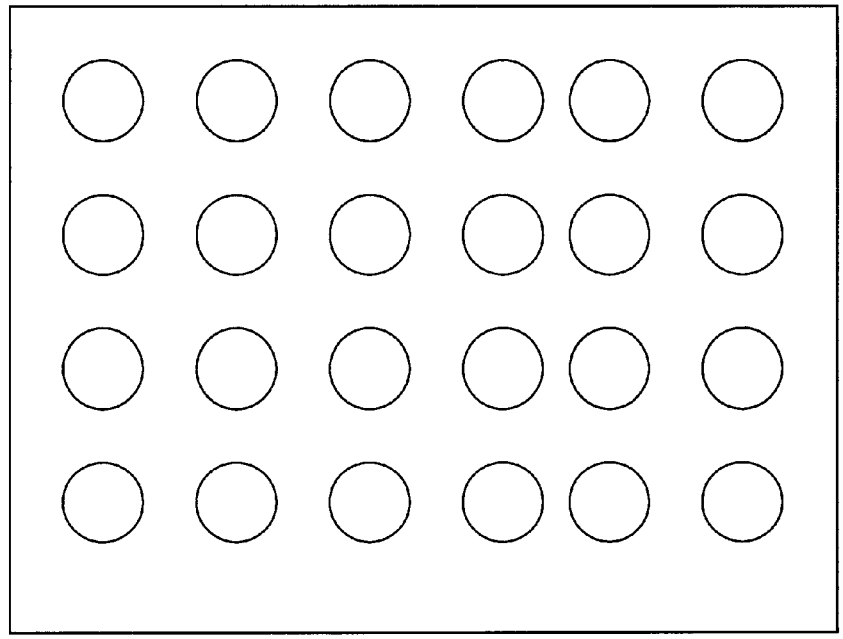
FIG. 18 represents an overhead view of vias formed in unprocessed photoresist.
Figure 19:
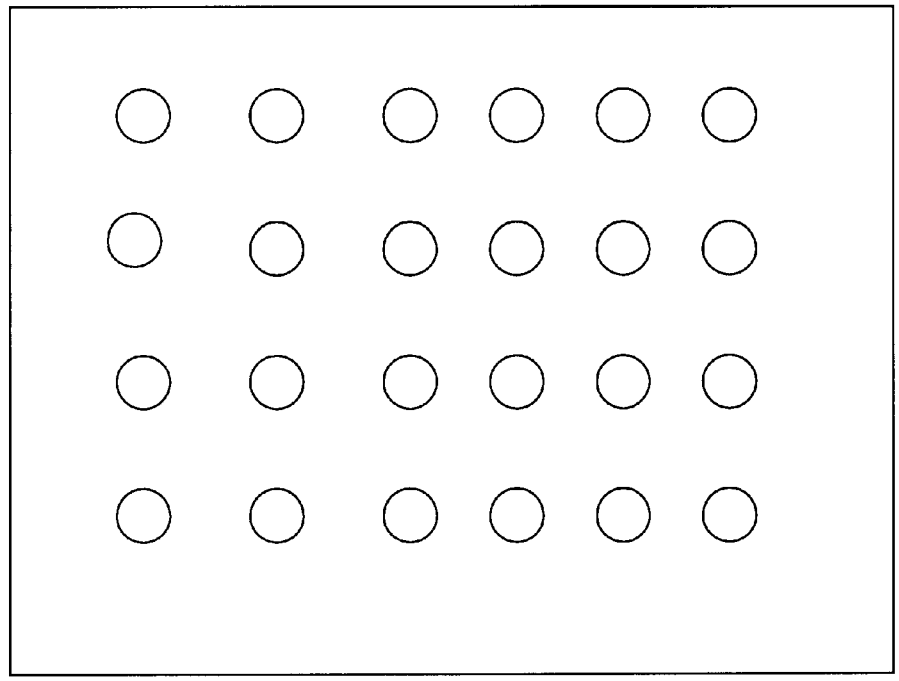
FIG. 19 represents an overhead view of vias in photoresist treated according to an embodiment of the present invention.

FIGS. 18 and 19 illustrate the effect of swelling on contact holes. Along these lines, FIG. 18 illustrates exposed and developed photoresist, resulting in the presence of vias in the photoresist. On the other hand, FIG. 19 illustrates vias formed in photoresist wherein the photoresist has been treated according to an embodiment of the present invention. As can been seen in comparing FIGS. 18 and 19, the vias shown in FIG. 19 are smaller than those shown in FIG. 18.

One great advantage of being able to control dimensions of features made of photoresist according to the present invention is that, for example, if vias having dimensions illustrated in FIG. 18 represent the limits of photolithography and vias having the comparative dimensions shown in FIG. 19 are not imagable, swelling the surrounding photoresist can permit formation of vias having a size such as that illustrated in FIG. 19.

According to another embodiment, any of a variety of vinyl type monomers that are capable of polymerization and/or addition to reactive groups on the photoresist polymer may be diffused into the photoresist. Prior or subsequent to generation of strong acid from photoinduced decomposition of the PAG may initiate polymerization and/or addition to the polymer. In the case of di- or multi-functional monomers, some crosslinking may also occur.

Vinyl ethers are especially suitable for polymerization initiated by a strong acid catalyst. UV-curable coatings based on such technology are commercially used in a number of applications. Vinyl ethers will predominantly self-polymerize, but are also capable of undergoing acid-catalyzed addition reactions with alcohols. Deep UV photoresist polymers contain phenol groups capable of undergoing such reaction with vinyl ethers, thus further anchoring the growing polymer chain in the photoresist matrix.

According to typical examples, vinyl monomers may contain groups that are resistant to plasma etching. For example, the vinyl monomers may include aromatic groups. Examples of such monomers include but are not limited to indene, benzofuran, and phenyl vinyl ether.

According to still another embodiment, highly volatile or gaseous monomers may be used. Utilizing such monomers may make it easier to attain high concentrations of the chemical around the photoresist structure, thus facilitating diffusion kinetics. Examples of such volatile monomers include methyl vinyl ether, which has a boiling point of about 5° C. to about 6° C., and 2,3-dihydrofuran, which has a boiling point of about 54° C. to about 55° C.

Another class of monomers capable of undergoing acid-catalyzed polymerization and/or addition to the photoresist polymer includes of epoxy-functional chemicals. Like vinyl ethers, epoxy-functional monomers have found commercial application in UV-curable coatings. Examples likewise include both those containing etch-resistant structures, such as (2,3-epoxypropyl)benzene, and very volatile or gaseous chemicals such as ethylene oxide or propylene oxide.

According to yet another example of a process of the present invention, it is possible to take advantage of the fact that free radicals are generated in the photoresist matrix upon UV irradiation. See Jordhamo and Moreau, SPIE, Vol. 2724, p. 588. Such free radicals may be employed to initiate the polymerization of free radical polymerizable monomers. Examples of such monomers include acrylic monomers, such as methyl methacrylate, for example, styrene, and acrylonitrile. The latter two represent monomers containing etch-resistant structures and very volatile monomers, respectively.

Initiation of many free-radically polymerizable monomers can be caused by UV irradiation alone. Whether the result of UV irradiation alone or in combination with another element, such as heat or presence of acid, absorption of the monomer into the photoresist structure preceded by, simultaneously with, or followed by UV irradiation may cause the formation of radicals that can initiate polymerization, thereby fixing the added monomer into the resist structure.

One advantage in utilizing monomers that are capable of self-polymerizing is that they do not need stoichiometric control. In the case of chemistries that must react with the photoresist polymer, such as those described in U.S. Pat. No. 5,173,393, it is possible to apply an excess of chemical that is not capable of reacting after all the accessible reactive polymer sites have been consumed. In such a case, volatile materials may remain behind in the resist and cause problems in subsequent processing as they outgas.

Furthermore, a stoichiometric amount of chemical treatment may not be sufficient to fill free volume and adequately stabilize the resist feature against substantial shrinkage. With the use of self-reactive chemicals, essentially complete reaction can take place regardless of the quantity of material diffused into the resist, thus providing greater control over critical dimensions and etch resistance.

According to a still further example of a process of the present invention, any one or more of a variety of chemicals that are susceptible to photolysis upon UV irradiation to form free radicals that are then capable of reacting with the photoresist polymer may be used. These chemicals contain photolabile bonds. Typically, the materials of this class that are utilized according to the present invention contain etch-resistant structures. The etch resistant structures can include aromatic rings. One example of these compounds include aryl halides. Examples of aryl halides include iodobenzene, bromobenzene, and chlorobenzene.

These chemicals may undergo bond scission upon irradiation. Phenyl radicals may result from the bond scission. The phenyl radicals can couple with other aromatic rings such as those found in DUV photoresist polymers. This reaction is by the diagrams illustrated below.

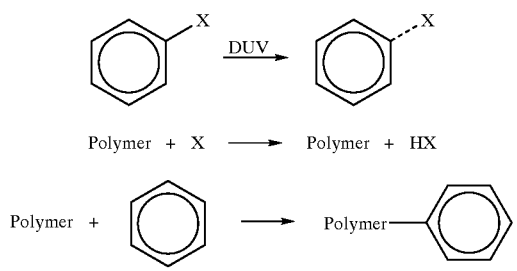

where X is Cl, Br, or I.

The result in this example may be a polymer with a higher density of aromatic rings and, thus, improved etch resistance. Other suitable chemicals include chlorosilanes. Any chlorosilane may be utilized. One example of a chlorosilane is dimethylphenylchlorosilane.

The preceding description of embodiments of the present invention illustrates the broad variety of photochemical reaction mechanisms available to meet the requirements of the invention. Many other chemistries are available, some of which may react via multiple mechanisms. Additional examples of chemistries are discussed below.

Sulfur dioxide is one of the compounds that me be utilized as one of the chemical(s) according to the present invention. Sulfur dioxide is a very versatile reagent that could undergo reaction with photoresist polymers. For example, sulfur dioxide may add to carbon-based radicals, such as those generated during photostabilization, to form sulfinate, or in the presence of oxygen, sulfonate groups.

Sulfur dioxide is a gas at standard temperature and pressure with good diffusivity and solubility in many organic polymers. The chemical addition of sulfur dioxide to organic polymers is an effective way to add mass. The molecular weight of sulfur dioxide is 64.

According to another mechanism, sulfur dioxide may react by copolymerizing with olefins, such as those created when deprotection occurs, to form polysulfones. According to still another reaction scheme, combination of sulfur dioxide with quinone radicals, such as those generated during photostabilization can lead to aromatic sulfone linkages. In any case, shrinkage is reduced at the same time that mass is added to increase etch resistance.

Another example of chemistry capable of reacting via multiple mechanisms includes chemicals containing alkyne functional groups. These compounds were discussed above with respect to their role as irreversible acid scavengers. Alkynes may also absorb UV light resulting in free radical formation. The resulting free radicals can then undergo a variety of reactions such a self-polymerization and/or addition reactions to aromatic rings, such as those found in photoresist polymers.

Chemicals that contain both reactive alkyne groups and aromatic rings may be particularly effective for increasing etch resistance of photoresist features. One example of such compounds is phenylacetylene.

Still another mechanism by which certain alkynes can photochemically react is illustrated in the case of butadiyne. Butadiyne absorbs light at about 124 nm or about 147 nm to form $C_2$ (elemental carbon) and acetylene. Elemental carbon has extremely high plasma etch resistance, as would be predicted from models based on carbon:hydrogen ratios.

It may be desirable and/or advantageous to utilize certain specialized equipment to carry out the chemical, thermal, and/or irradiation treatment of the photoresist patterns. According to one embodiment, the apparatus may include a closed chamber. The chamber may include a thermally controlled chuck. Irradiation may be carried out with a controllable, variable intensity UV source with wavelength output appropriate for the desired photoreactions.

It may also be desirable to carry at least a portion of the process out at subatmospheric pressure. Accordingly, an apparatus for carrying out processes according to the present invention may include a mechanism for evacuating the chamber with a vacuum pump. A vacuum pump may be desirable for a number of reasons.

Typically, processes according to the present invention may be carried out at pressures of about 1 torr to about 100 atmospheres. Along these lines, the at least one chemical may be a gas, liquid, or vapor under the conditions utilized in the processes.

Examples of the reasons include that oxygen and air may be removed from the processing chamber in the event that this atmosphere causes deleterious effects on the desired reaction. Also, causing a vacuum to form in the chamber provides a means of facilitating vapor formation with chemical treatments that are liquids at ambient temperatures and pressures. Furthermore, the ability to draw a vacuum on the chamber allows gases and vapors to be purged from the chamber before it is vented to the atmosphere, thus preventing release of potentially toxic materials.

In the case of treatment with gaseous chemical(s), it typically is desirable to include a mechanism for delivering the gas or gases to the chamber with control of pressures and flow rates. Whether or not the treatment chemical(s) are gaseous, the apparatus may include mechanism(s) for controlling the atmosphere within the processing chamber. Along these lines, it may be desirable to expose the photoresist features to a non-oxidizing atmosphere. Therefore, an apparatus according to the present invention may include mechanism for introducing or withdrawing one or more gasses from the chamber.

In the case of treatment with a chemical vapor, it may be desirable to include a heated container of the liquid with a heated conduit to a heated chamber. In this way, through control of the temperature and pressure of the entire system, a desired vapor pressure of a chemical may be maintained in the chamber and around the wafer.

The present invention also provides a process for forming a semiconductor device structure. Such a process may include depositing a layer of photoresist on a semiconductor substrate, such as a silicon wafer referred to above. A pattern of features may be exposed in the photoresist. The photoresist features may then be developed. Next, the photoresist features may be exposed to a photostabilization process.

After exposure and development, the photoresist features may be exposed to at least one compound that will react with at least one of itself and at least one component of the photoresist. The reaction may take place in the presence of at least one at least one component of the photoresist. Subsequent to exposure to the at least one chemical, the photoresist features may be exposed to reaction initiating energy during at least one of prior to, simultaneous with and subsequent to exposing the photoresist features to the at least one compound. The reaction initiating energy referred to above or anywhere else herein can include ultraviolet radiation, e-beam, ion bombardment, and/or any other energy that may provide the energy necessary to initiate and/or drive the reactions described herein.

The alteration of the photoresist leads to another aspect of the present invention. This aspect relates to an altered exposed and developed photoresist. The photoresist includes photoresist features with at least one compound bonded to or contained within the photoresist. The photoresist features have already been exposed to photostabilization and can have the same, smaller, or larger dimension(s) than the features prior to photostabilization.

EXAMPLES

The following represent specific examples of processes and results that were achieved according to the present invention. The examples should only be considered illustrative.

Vapor Treatment Chamber

In order to carry out the following experiments a specially designed vapor treatment tool was constructed. The tool includes an essentially vacuum tight, heated chamber fitted with a heated wafer chuck and connected to a vacuum pump. A manometer permits measurement of the vapor pressure inside the chamber.

Additionally, a heated tank for holding liquid chemicals, such as DHF, is connected to the chamber by a heated vapor line fitted with a valve. A separate line allows the chamber to be vented to nitrogen. The top of the chamber is fitted with a quartz plate through which a wafer can be observed as it is being treated, or through which UV light can pass if it is desired to irradiate the wafer during vapor treatment.

By having all or nearly all of the surfaces inside the chamber and vapor lines heated, it is possible to maintain a vapor phase of a chemical inside the chamber and above the wafer while avoiding condensation on the surfaces. The temperature of the tank can be used to control the vapor pressure of the chemical.

According to one embodiment, the process of vapor treating a wafer involves:

placing the wafer on the chuck heated to the desired temperature;

closing the chamber door and opening the valve to the vacuum pump until full vacuum is reached;

closing the valve to the vacuum pump;

opening the valve to the chemical tank and allowing the vapor pressure to reach the desired level (usually the equilibrium vapor pressure);

closing the valve to the chemical tank after the desired treatment time has elapsed;

optionally opening the valve to the vacuum pump to remove the vapor from the chamber; and venting the chamber to nitrogen to allow it to reach atmospheric pressure, opening the chamber door and removing the wafer.

Example 1

Effect of Prior UV Exposure on Swelling Rate in an ESCAP Type Photoresist

8" silicon wafers were spin coated with UV-6™, an ESCAP type deep UV photoresist from Shipley Company, and soft-baked at about 130° C. for about 45 seconds on a contact hot plate. The wafers were finally processed at about 140° C. for about 60 seconds on a contact hot plate to simulate the postexpose bake that would normally be encountered during photoimaging/patterning. Coating thicknesses were then measured with a FOCUS™ ellipsometer from Rudolph Technologies, Inc.

Some of the coated wafers were then exposed to chemical vapors as described below.

Other of the wafers were processed with UV light as follows. Coated wafers were placed in a 300 mm PCU Photostabilizer from Eaton Corp., Fusion Systems Division and exposed to UV irradiance of approximately 105 mW/cm$^2$ from an H-Mod bulb, at ambient temperature. This bulb produces a broad band spectral output including significant levels around 248 nm. Any other bulb producing such an output may also be utilized.

The wafers were exposed for about 30 seconds at ambient temperature. This exposure is more than enough to fully decompose the photoacid generator and release the acid.

All wafers, exposed and unexposed, were then treated in the specially designed chamber with 2,3-dihydrofuran (DHF) vapor at approximately 200 torr and about 30° C. for varying lengths of time as indicated below in Table 1 below.

TABLE 1

Effect of UV Exposure on DHF Swelling Rate in ESCAP Photoresist

| | | Post-Treatment Thicknesses (Angstroms) | | | |
| | | UV | | No UV | |
| INITIAL THICKNESS | TREATMENT TIME | Post-DHF | Post 140° C. | Post-DHF | Post 140° C. |
| --- | --- | --- | --- | --- | --- |
| 8715 | 1 | 11064 | 9713 | | |
| 8630 | 5 | | | 8816 | 8125 |
| 8665 | 5 | 11576 | 10123 | | |
| 8658 | 20 | 12829 | 10869 | | |
| 8643 | 60 | | | 9193 | 8427 |
| 8641 | 60 | 15806 | 11773 | | |
| 8667 | 120 | | | 9499 | 8667 |

There was no change in appearance of the resists that had not been exposed to UV light. On the other hand, the resists that had been irradiated underwent dynamic color changes within seconds after exposure to DHF vapor. At the end of the vapor treatment, the chamber was vented to nitrogen to allow a return to atmospheric pressure.

Coated wafers were then processed in the Photostabilizer for about 30 seconds with UV irradiance of approximately 105 mw/cm$^2$ from an H-Mod bulb, at ambient temperature. Coating thicknesses were then measured via ellipsometry. All wafers were then baked at about 140° C. for about 60 seconds and the thicknesses remeasured. The results of this example are illustrated graphically in FIG. 3.

Figure 3:
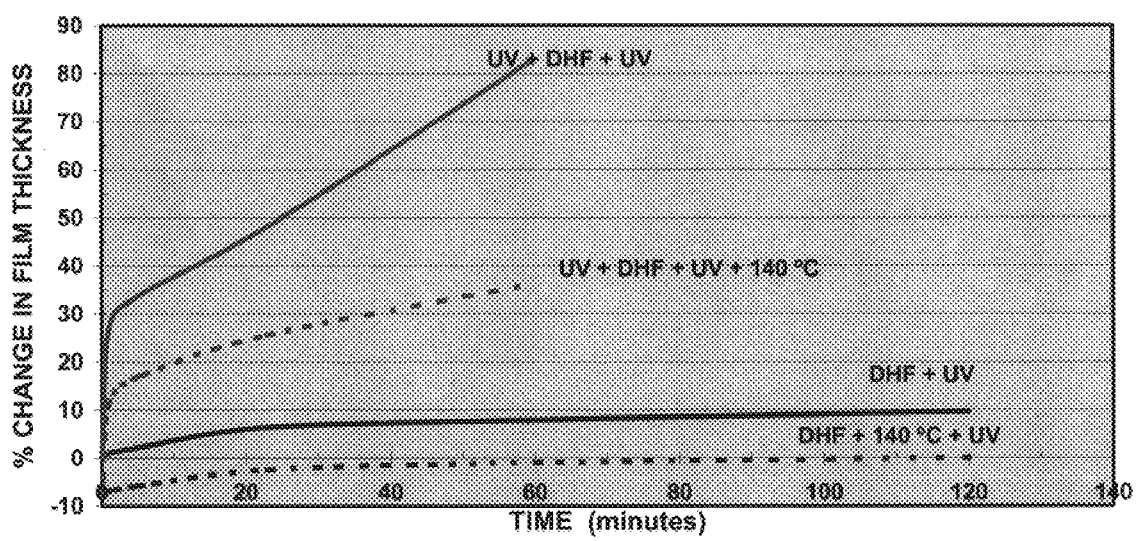
FIG. 3 represents a graph illustrating a relationship between percent change in film thickness and time.

The results shown in FIG. 3 indicate a dramatic increase in swelling rate for the UV irradiated case. The thickness of this particular resist without prior pre-treatment decreases by about 8% upon exposure to UV irradiation and subsequent heating to about 140° C. The DHF-treated samples also shrink after heating at 140° C., possibly due to a combination of deprotection, polymerization and/or volatilization of absorbed but previously unreacted DHF.

In the case of irradiated resist, however, even vapor treatment for about 1 minute results in post-140° C. bake net thickness increases of about 10%. By comparison, non-irradiated resist requires about two hours of vapor exposure time to achieve a net 0% change in film thickness after the 140° C. bake.

Example 2a

Effect of Prior High Intensity UV Exposure on DHF Interaction with an ESCAP Type Photoresist Wafers coated as in Example 1 were exposed to UV irradiance of approximately 275 mW/cm$^2$ from an H-Mod bulb for about 30 seconds at ambient temperature. The wafers were then exposed to DHF vapor for varying times and temperatures as indicated in Table 2.

TABLE 2

Effect of High Intensity UV Exposure on DHF Interaction with an ESCAP Type Photoresist

| TEMPERATURE | TIME (min) | OBSERVATIONS |
| --- | --- | --- |
| 30° C. | 1 | Surface became dull and grainy within about 30 sec. |
| 40° C. | 1 | Color changes and patchy dull areas |
| 50° C. | 1 | Color changes; remained glossy |
| 50° C. | 5 | Remained glossy until last approx. 30 sec., dull spot began forming in middle |

The grainy formations on the surface were unaffected by a post bake carried out at a temperature of about 140° C. Increasing temperature and decreasing treatment time reduced the instances of this phenomenon.

Figure 4:
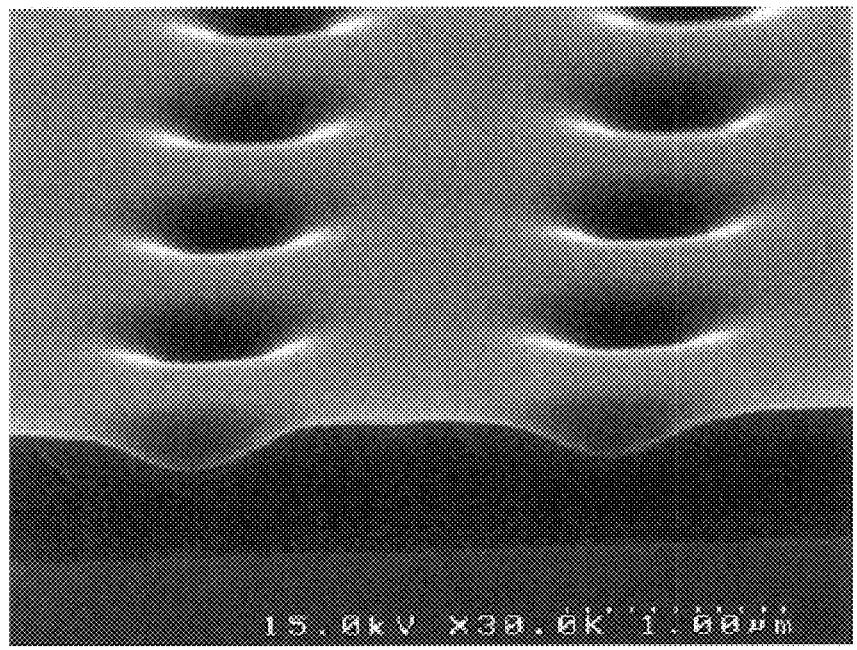
FIG. 4 represents a photomicrograph illustrating in a perspective view vias treated according to an embodiment of a process according to the present invention.
Figure 5:
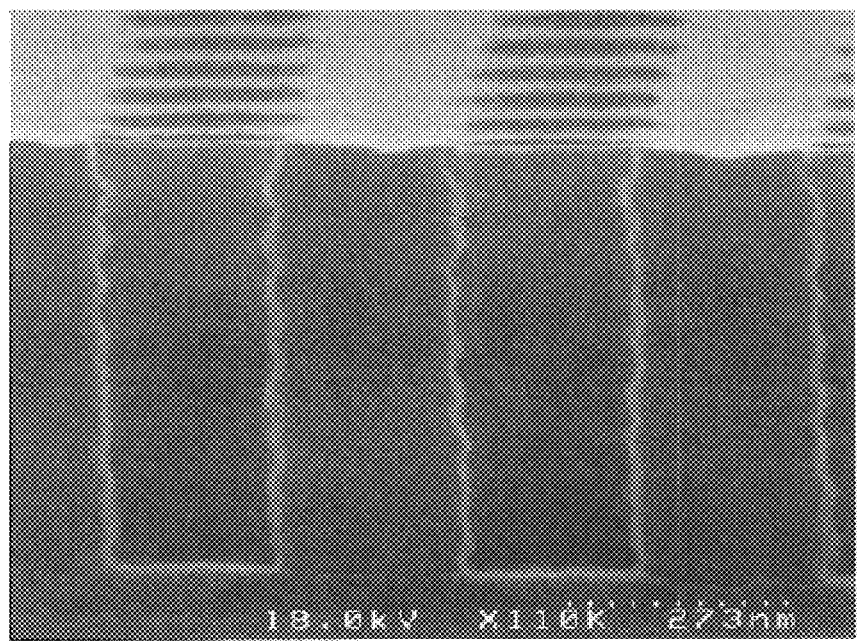
FIG. 5 represents a photomicrograph illustrating in a cross-sectional view vias not treated according to a process according to the present invention.
Figure 6:
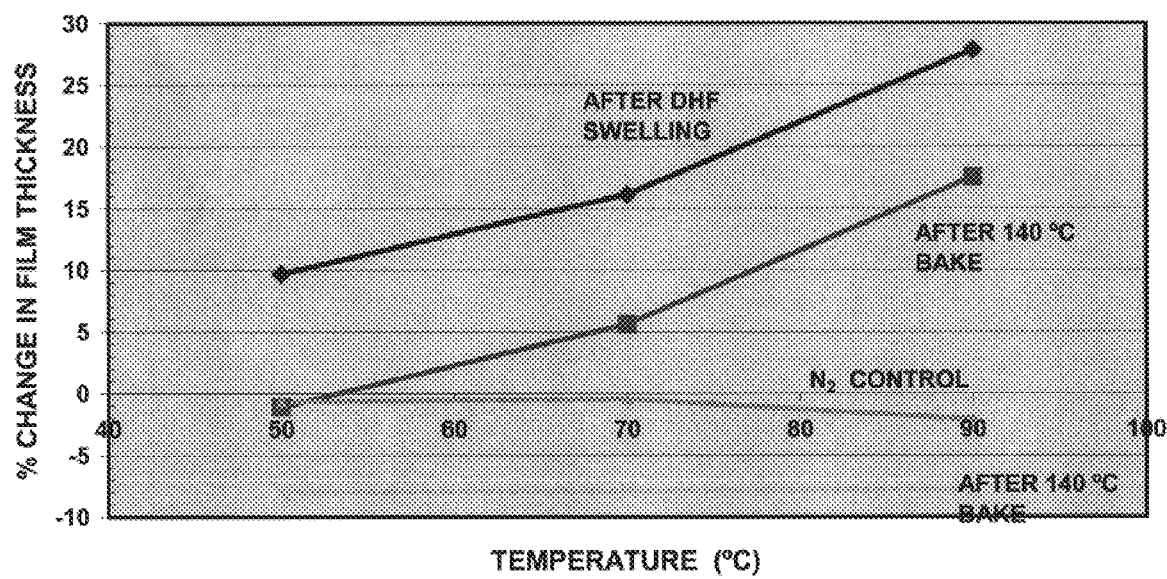
FIG. 6 represents a graph illustrating relationships between a percent change in film thickness with respect to temperature.

Other wafers were processed in the same manner with ultraviolet light and treated with DHF vapor for one minute at the temperatures indicated in FIG. 6. In all cases the photoresist coatings remained smooth and glossy. Included in the graph shown in FIG. 4 are data points for wafers that were processed in exactly the same manner except using nitrogen instead of DHF.

It can be seen in FIG. 6 that high swelling rates of DHF in ESCAP resist exposed to high intensity UV light can readily be achieved at higher temperatures while avoiding surface defects. Net thickness gains are readily achievable, even after baking at about 140° C., whereas the nitrogen-treated controls shrink by about 8%.

Comparative Example 2b

Effect of Prior High Intensity UV Exposure on Acetone Interaction with an ESCAP Type Photoresist To test the hypothesis that the high swelling rates observed are due to the ability of DHF to polymerize upon contact with the photoacid generated in the resist, the behavior of acetone was investigated for comparison. Acetone is nearly equal in volatility to DHF. It is also a good solvent for the resist, hence, should diffuse readily. Unlike DHF, acetone does not have a mechanism for rapid polymerization.

Two coated wafers were processed with UV light as in Example 2a. The wafers were then treated for about one minute and about five minutes with acetone vapor at about 190 torr and about 70° C. In both cases, there was no visible change in the resist coating. Resulting thickness changes, measured by ellipsometry, were about 0.76% and about 2.07%, respectively. A third wafer, unexposed to UV light, was similarly treated with acetone vapor for one minute, resulting in no detectable thickness change.

The shrinkage after one minute of acetone vapor treatment was nearly equivalent to the nitrogen treated case, as illustrated in FIG. 6. This indicates that no significant reaction or mass addition took place. DHF, by contrast, increased the resist thickness by about 16% under these conditions.

The greater film loss after five minutes of acetone treatment is probably due to further deprotection occurring at about 70° C. The non-UV exposed resist undergoes no change in thickness because deprotection cannot occur and acetone does not react.

Example 3

Effect of Prior High Temperature, High Intensity UV Exposure on DHF Interaction with an ESCAP Type Photoresist Wafers coated as in Example 1 were exposed in a photostabilizer to UV irradiance of approximately 275 mW/cm$^2$ from an H-Mod bulb for about 30 seconds while ramping the temperature from approximately 80° C. to approximately 120° C. Then, the wafers were baked at about 140° C. for about one minute. Ellipsometry indicated that the wafers had lost about 8% of the film thickness.

Figure 7:
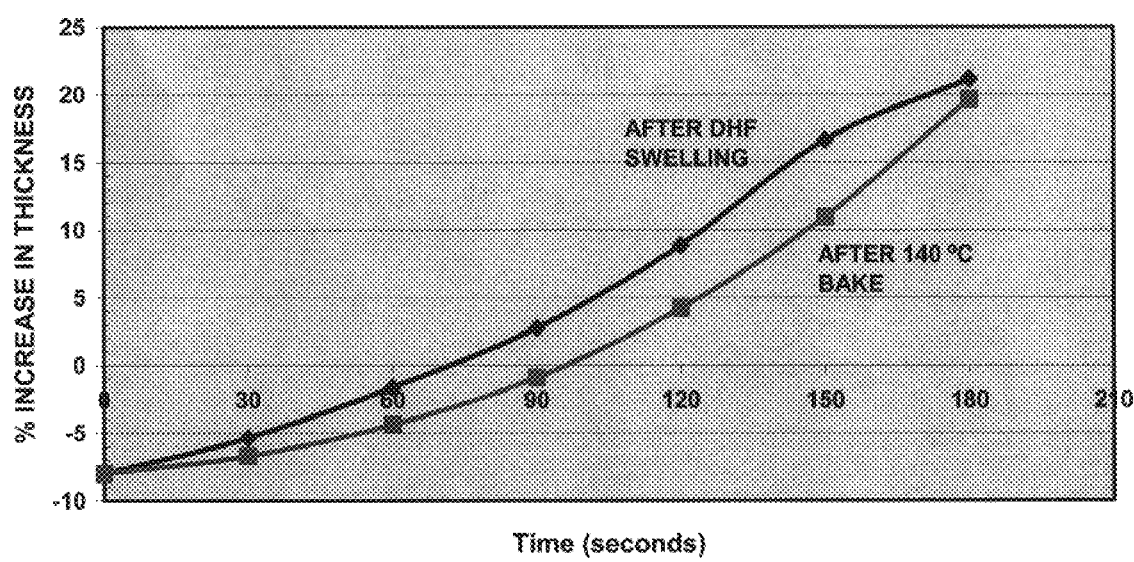
FIG. 7 represents a graph illustrating relationships between a percent change in film thickness with respect to time.

The wafers were then exposed to DHF vapor for varying times at about 90° C., as indicated in FIG. 7. A final bake of approximately 140° C. for approximately one minute caused shrinkage. This shrinkage is also portrayed in FIG. 7.

Thus, even under conditions where the resist has been crosslinked, densified and fully deprotected, reasonable swelling rates may still be obtained at higher temperatures.

Example 4

Effect of DHF Vapor on High Temperature, High Intensity UV Exposed Group Lines Patterned in an ESCAP-Type Photoresist An ESCAP-type photoresist, KRF M20G from JSR Micro-Electronics, Inc., was coated on top of a Bottom Anti-Reflective Coating (BARC) on 8" silicon wafers and patterned with a test mask containing various features.

One of these wafers was treated as follows. First, the wafer was exposed in a Photostabilizer to UV irradiance of approximately 275 mW/cm$^2$ from an H-Mod bulb for 30 seconds while ramping the temperature from about 80° C. to about 120° C. Then, the wafer was baked at about 140° C. for one minute.

Ellipsometry indicated that the resist had lost about 8% of its film thickness. The wafer was then exposed to DHF vapor for about 90 seconds at about 90° C., resulting in a net increase of about 17.8% in film thickness. A final bake at approximately 140° C. of a portion of this wafer for about one minute caused additional shrinkage.

Figure 8:
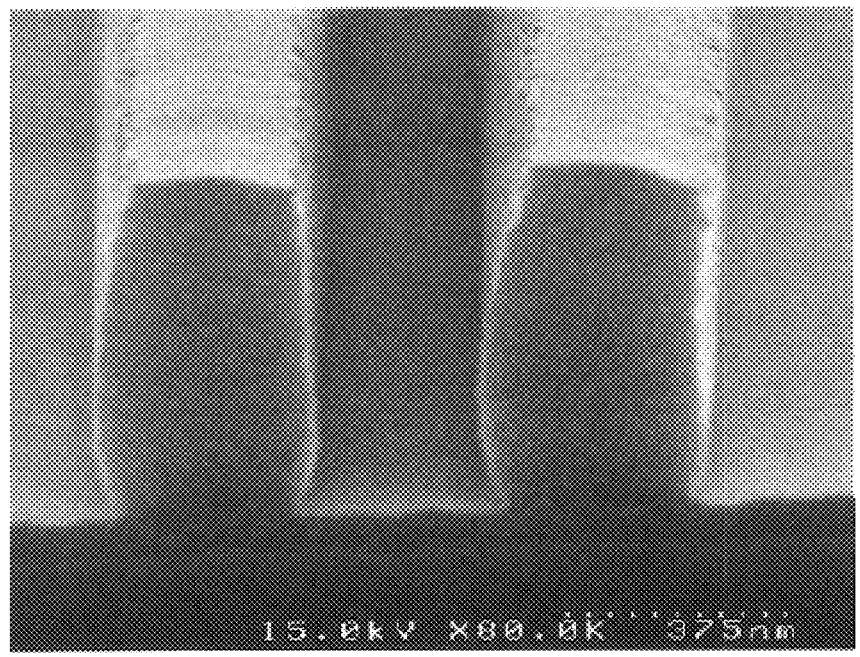
FIG. 8 represents a photomicrograph illustrating in a cross-sectional view paired lines of photoresist treated according to a process according to the present invention prior to a post-exposure bake process.
Figure 9:
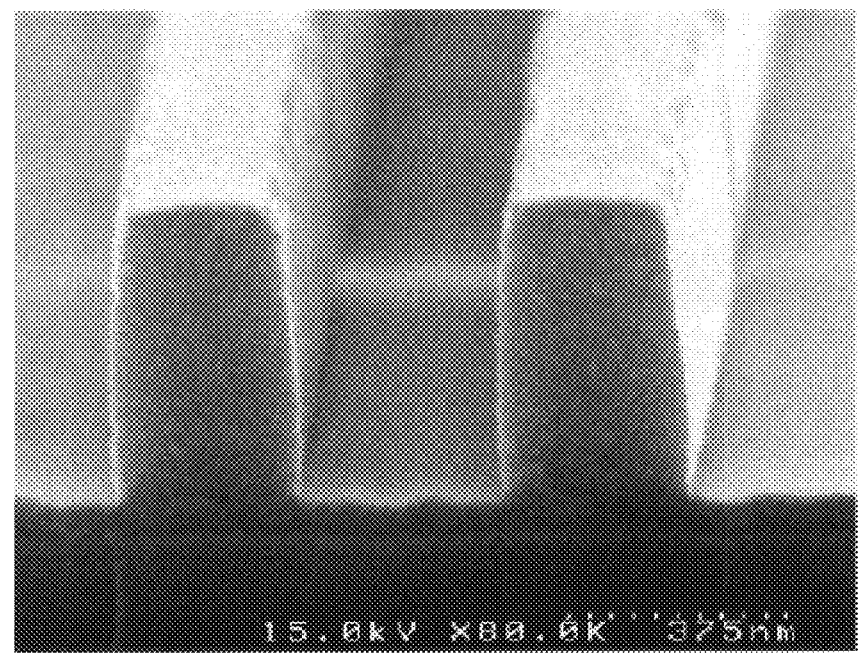
FIG. 9 represents a photomicrograph illustrating in a cross-sectional view paired lines treated according to the process according to the present invention utilized to treat the paired lines shown in FIG. 8 and subjected to a post-exposure bake process.
Figure 10:
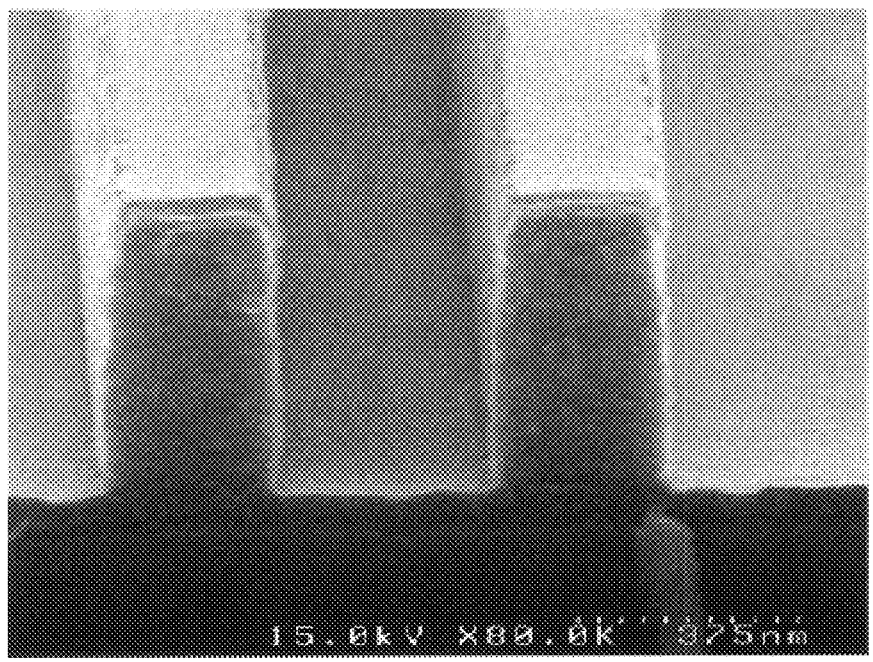
FIG. 10 represents a photomicrograph illustrating in a cross-sectional view paired lines not treated according to a process according to the present invention and not subjected to a post-exposure bake process.
Figure 11:
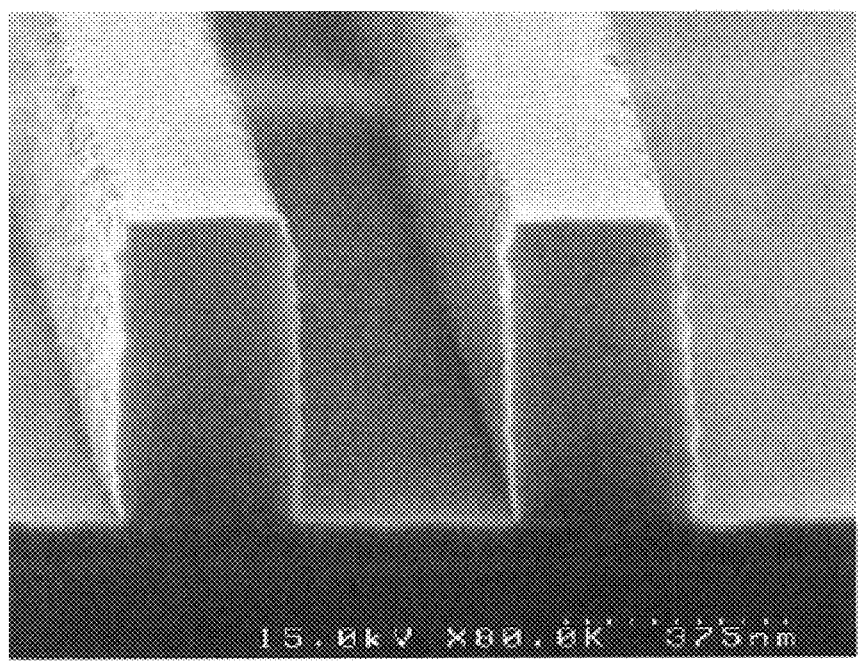
FIG. 11 represents a photomicrograph illustrating in a cross-sectional view paired lines not treated according to a process according to the present invention and subjected to a photostabilization process.
Figure 12:
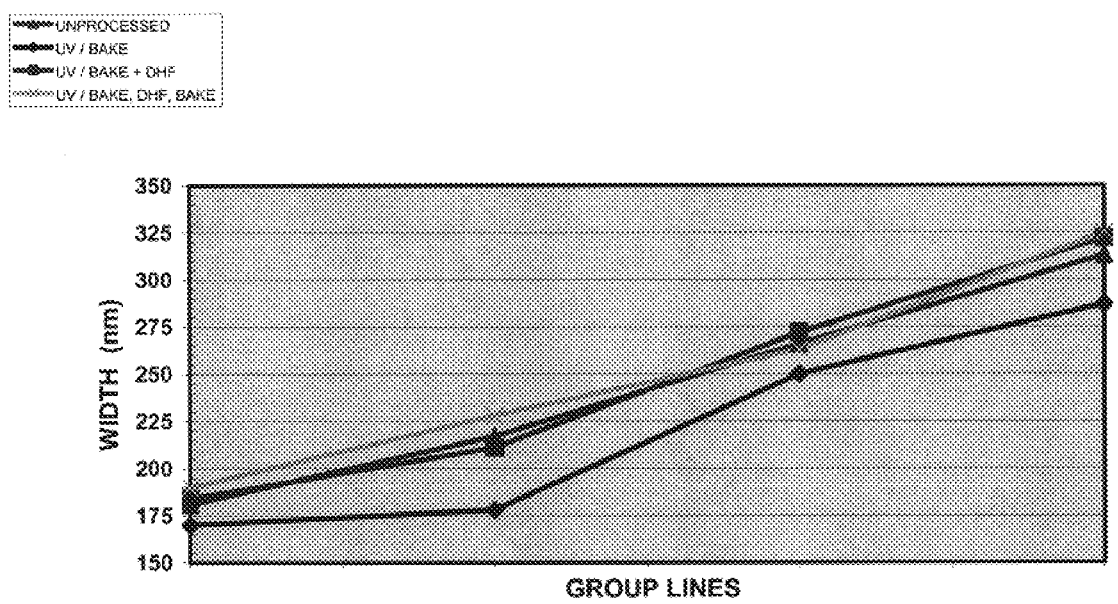
FIG. 12 represents a graph illustrating thickness of various groups of lines of photoresist treated according to various regimens.

Scanning Electron Microscopy (SEM) micrographs of a series of paired lines from a cleaved portion of this wafer both before, as shown in FIG. 8, and after, as shown in FIG. 9, the bake at about 140° C. were compared with those of wafers which had been unprocessed, as shown in FIG. 10, or UV/baked only, as shown in FIG. 11. Measurements of these lines were also made, as illustrated in FIG. 12. The results demonstrate the ability of the DHF treatment to yield a photostabilized resist feature much closer to the original dimension than a process that uses only UV and heat.

Example 5

Effect of DHF Vapor on High Temperature, High Intensity UV Exposed Vias Patterned in an ESCAP-Type Photoresist An ESCAP-type photoresist, KRF M20G from JSR Micro-Electronics, Inc., was coated on top of a Bottom Anti-Reflective Coating (BARC) on 8" silicon wafers and patterned with a test mask containing various features.

One of these wafers was treated as follows. First, the wafer was exposed in a Photostabilizer to UV irradiance of approximately 275 mW/cm$^2$ from an H-Mod bulb for 30 seconds while ramping the temperature from about 80° C. to about 120° C., then it was baked at about 140° C. for one minute. Ellipsometry indicated that the resist had lost about 8% of its film thickness. The wafer was then exposed to DHF vapor for about 80 seconds at approximately 90° C., resulting in a net increase of about 20.5% in film thickness. A final bake at about 140° C. of a portion of this wafer for about one minute caused additional shrinkage.

Figure 13:
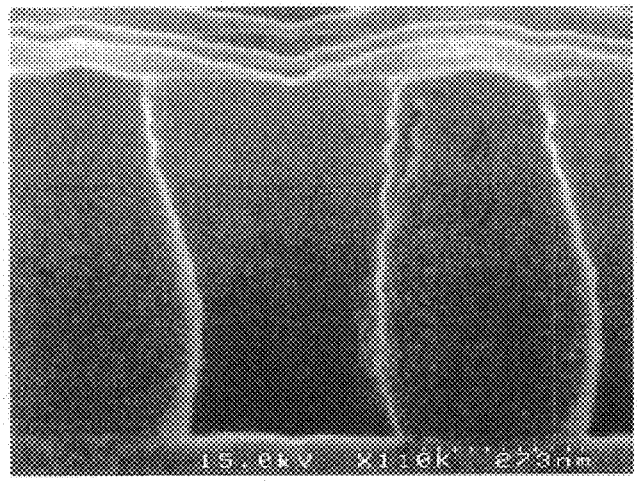
FIG. 13 represents a photomicrograph illustrating in a cross-sectional view paired lines of photoresist treated according to a process according to the present invention prior to a post-exposure bake process.
Figure 14:
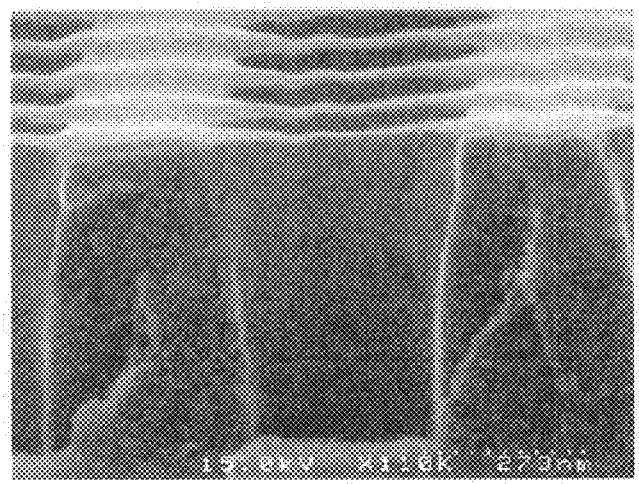
FIG. 14 represents a photomicrograph illustrating in a cross-sectional view paired lines treated according to the process according to the present invention utilized to treat the paired lines shown in FIG. 13 and subjected to a post-exposure bake process.
Figure 15:
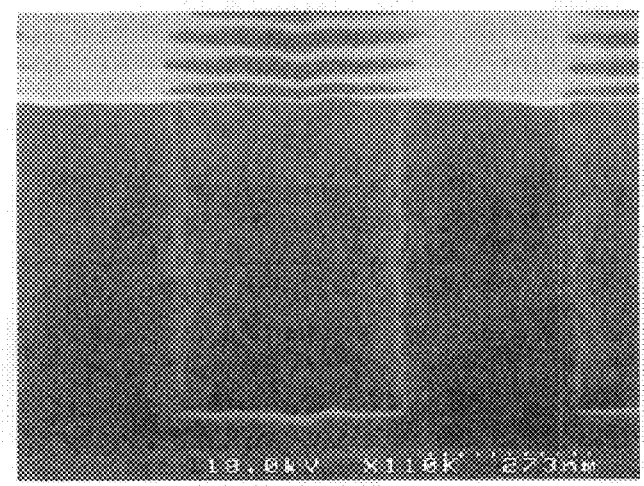
FIG. 15 represents a photomicrograph illustrating in a cross-sectional view paired lines not treated according to a process according to the present invention and not subjected to a post-exposure bake process.

Scanning Electron Microscopy (SEM) micrographs of a series of vias from a cleaved portion of this wafer both before, as shown in FIG. 13, and after, as shown in FIG. 14, the bake at about 140° C. were compared with those of wafers which had been unprocessed, as shown in FIG. 15. The results demonstrate the ability of the DHF treatment to yield a via which is narrower than that of the unprocessed pattern due to swelling of the surrounding photoresist. Additionally, even though this process includes photostabilization (UV and heat)as a first step, a process using only UV and heat causes vias to become larger than those of the unprocessed pattern due to shrinkage of the surrounding photoresist.

Example 6

Effect of Prior UV Exposure on Swelling Rate in an Acetal Type Photoresist

8" silicon wafers were spin coated with PEK 1037A acetal resist from Sumitomo and soft-baked at about 90° C. for about 90 seconds on a contact hot plate. The wafers were then processed at about 110° C. for about 90 seconds on a contact hot plate to simulate the post-expose bake that would normally be encountered during photoimaging/patterning. Coating thicknesses were then measured with a FOCUS™ ellipsometer from Rudolph Technologies, Inc.

Some of the coated wafers were then exposed to chemical vapors as described below.

Other of the wafers were processed with UV light as follows. Coated wafers were placed in a 300 mm PCU Photostabilizer from Eaton Corp., Fusion Systems Division and exposed to UV irradiance of approximately 105 mW/cm$^2$ from an H-Mod bulb for about 30 seconds at ambient temperature.

All wafers, exposed and unexposed, were then treated in the specially designed chamber with 2,3-dihydrofuran (DHF) vapor at approximately 220 torr and about 30° C. for varying lengths of time.

There was no change in appearance of the resists that had not been exposed to UV light. On the other hand, the resists that had been irradiated underwent dynamic color changes within seconds after exposure to DHF vapor.

Coated wafers were then processed in the Photostabilizer with UV irradiance of approximately 105 mW/cm$^2$ from an H-Mod bulb for about 30 seconds at ambient temperature. Coating thicknesses were then measured via ellipsometry. All wafers were then baked at about 140° C. for about 60 seconds and the thicknesses remeasured. The results are illustrated graphically in FIG. 16.

Figure 16:
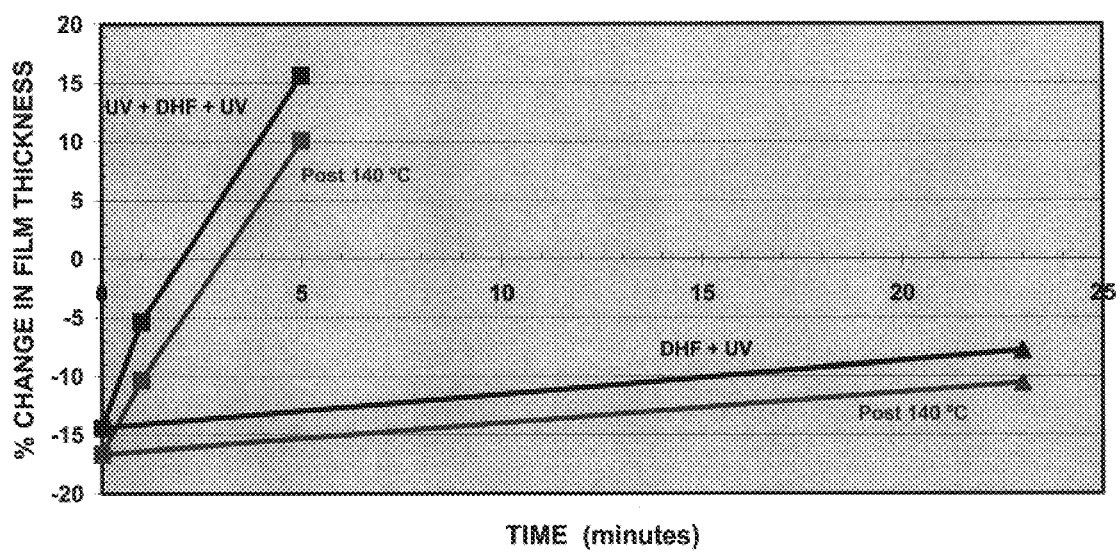
FIG. 16 represents a graph illustrating relationships between a percentage change in film thickness with respect to time for photoresist coated on silicon wafers and treated according to various regimens.

The results shown in FIG. 16 indicate a dramatic increase in swelling rate for the UV irradiated case, as was also observed in the case of ESCAP resist. The thickness of this particular resist without prior pre-treatment decreases by about 14% upon exposure to UV irradiation at ambient temperatures and by about 17% after subsequent heating to about 140° C. Upon subsequent exposure to DHF, however, the thickness can be totally regained in under about 5 minutes.

Example 7

Effect of Prior High Temperature, High Intensity UV Exposure on DHF Interaction with an Acetal Type Photoresist Wafers coated as in Example 6 were exposed in a photostabilizer to UV irradiance of approximately 275 mW/cm$^2$ from an H-Mod bulb for about 30 seconds while ramping the temperature from about 80° C. to about 120° C. Then, the wafers were baked at about 140° C. for about one minute. Ellipsometry indicated that the wafers had lost about 17% of the film thickness.

Figure 17:
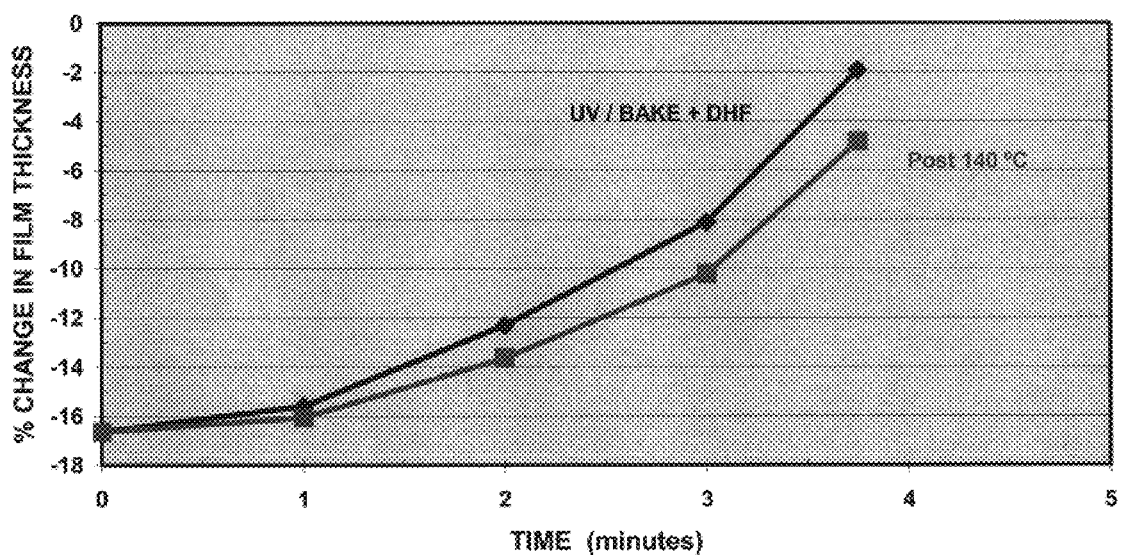
FIG. 17 represents a graph illustrating relationships between a percentage change in film thickness with respect to time for photoresist coated on silicon wafers and treated according to various regimens.

The wafers were then exposed to DHF vapor for varying times at about 90° C., as indicated in FIG. 17. A final bake of about 140° C. for about one minute caused shrinkage. This shrinkage is also portrayed in FIG. 17.

Thus, even under conditions where the resist has been crosslinked, densified and fully deprotected, reasonable swelling rates may still be obtained at higher temperatures. Most of the resist thickness lost due to the prior UV and thermal treatment can be regained.

Example 8

Demonstration of Enhanced Etch Resistance of ESCAP Resist Treated According to the Invention 6" silicon wafers were spin coated with UV-6™, an ESCAP type deep UV photoresist from Shipley Company, soft-baked at 130° C. for 45 seconds on a contact hot plate. The wafers were finally processed at about 140° C. for about 60 seconds on a contact hot plate to simulate the post-expose bake that would normally be encountered during photoimaging/patterning. Coating thicknesses were then measured with a FOCUS™ ellipsometer from Rudolph Technologies, Inc.

Some of the coated wafers were then processed as follows:

Process 1

Wafers were exposed in a Photostabilizer to UV irradiance of approximately 275 mW/cm$^2$ from an H-Mod bulb for about 30 seconds under nitrogen while ramping the chuck temperature from about 80° C. to about 120° C. Finally, the wafers were heated at about 140° C. for about 60 seconds.

Process 2

Wafers were exposed in a Photostabilizer to UV irradiance of approximately 275 mW/cm$^2$ from an H-Mod bulb for about 30 seconds under nitrogen while ramping the chuck temperature from about 80° C. to about 120° C. The wafers were then treated with about 225 torr DHF vapor while heating at about 90° C. for about 75 seconds. Finally, the wafers were heated at about 140° C. for about 60 seconds.

All coated wafers, including several unprocessed controls, were then processed in a single chamber Drytek plasma etcher using the following recipe designed for etching approx. 1200 Å of aluminum:

STEP 1

BCl$_3$—60 sccm

Cl$_2$—20 sccm

N$_2$—40 sccm

Pressure=220 mtorr

RF power=170 W

Start delay=30 sec

Max. time=60 sec.

STEP 2

SF$_6$—10 scam

He—20 scam

Pressure=180 mtorr

RF power=160 W

Start delay=10 sec

Max. time=30 sec.

Film thicknesses were then measured. The total film losses are reported in Table 3 below:

TABLE 3

FILM THICKNESS MEASUREMENTS FOR ESCAP ETCH STUDY

| FILM THICKNESS AFTER COATING (ANGSTROMS) | FILM THICKNESS AFTER ETCH (ANGSTROMS) | FILM LOSS (ANGSTROMS) | FILM LOSS (%) |
|---|---|---|---|
| UNPROCESSED: | | | |
| 9119 | 6579 | 2540 | 27.85 |
| 9258 | 6549 | 2709 | 29.26 |
| 9296 | 6339 | 2957 | 31.81 |
| 9256 | 6552 | 2704 | 29.21 |
| AVERAGE: | | 2728 | 29.5 ± 1.7 |
| PROCESS 1: | | | |
| 9237 | 5830 | 3407 | 36.88 |
| 9470 | 5858 | 3612 | 38.14 |
| 9179 | 5908 | 3271 | 35.64 |
| 9142 | 6189 | 2953 | 32.30 |
| AVERAGE: | | 3311 | 35.7 ± 2.5 |
| PROCESS 2: | | | |
| 9500 | 7063 | 2437 | 25.65 |
| 9321 | 7161 | 2160 | 23.17 |
| 9288 | 7365 | 1923 | 20.70 |
| 9172 | 7106 | 2066 | 22.53 |
| 9118 | 7113 | 2005 | 21.99 |
| 9375 | 7212 | 2163 | 23.07 |
| AVERAGE: | | 2126 | 22.9 ± 1.6 |

It can thus be seen that resist treated according to the invention had about 22% less total film loss after etching than unprocessed resist, and about 36% less film loss than UV/Baked resist.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. A process for altering developed photoresist features, the method comprising:

exposing the developed photoresist features to at least one compound that will react with itself, the reaction taking place in the presence of at least one component of the photoresist; and exposing the developed photoresist features to reaction-initiating energy during at least one time selected from the group consisting of prior to, simultaneous with and subsequent to exposing the photoresist features to the at least one compound.

2. The process according to claim 1, wherein the at least one compound is a vapor, gas or a liquid.

3. The process according to claim 2, wherein as a result of reaction of the at least one compound with itself the photoresist features have substantially the same dimensions.

4. The process according to claim 1, further comprising:

exposing the photoresist features to temperatures above room temperature during at least one time selected from the group consisting of prior to, simultaneous with exposure of the photoresist features to the reaction-initiating energy.

5. The process according to claim 4, wherein the photoresist features are exposed to reaction-initiating energy and temperatures above room temperature continuously.

6. The process according to claim 4, wherein the photoresist features are exposed to reaction-initiating energy and temperatures above room temperature intermittently.

7. The process according to claim 4, wherein the temperatures are from about 20° C. to about 250° C.

8. The process according to claim 1, wherein the photoresist features are exposed to reaction-initiating energy continuously.

9. The process according to claim 1, wherein the photoresist features are exposed to reaction-initiating energy intermittently.

10. The process according to claim 1, wherein the photoresist features are exposed to the at least one compound for a total of time of about 5 seconds to about 1 hour.

11. The process according to claim 1, wherein the photoresist features are exposed to reaction-initiating energy for a total time of about 5 seconds to about 5 minutes.

12. The process according to claim 1, wherein the photoresist features are exposed to temperatures above room temperature for a total time of about 5 seconds to about 1 hour.

13. The process according to claim 1, wherein the photoresist features are exposed to the at least one compound at a temperature of about 20° C. to about 200° C.

14. The process according to claim 1, further comprising:
photostabilizing the photoresist features.

15. The process according to claim 14, wherein the photostabilization generates at least one acid in the photoresist and the acid catalyzes reaction of the compound with itself.

16. The process according to claim 14, wherein the photostabilization generates free radicals in the photoresist and the free radicals catalyze reaction of the compound with itself.

17. The process according to claim 16, wherein the at least one compound comprises at least one monomer selected from the group consisting of acrylic monomers, styrene monomers, and acrylonitrile monomers.

18. The process according to claim 1, wherein reaction of the at least one compound with itself adds mass to the photoresist features.

19. The process according to claim 1, wherein reaction of the at least one compound with itself increases at least one of the width and the height of the photoresist features.

20. The process according to claim 1, wherein reaction of the at least one compound with itself decreases at least one of the width and the height of the photoresist features.

21. The process according to claim 1, wherein reaction of the at least one compound with itself increases etch selectivity of the photoresist.

22. The process according to claim 1, wherein reaction of the at least one compound with itself increases critical dimension control in the photoresist features.

23. The process according to claim 1, wherein the photoresist features comprise deep UV photoresist.

24. The process according to claim 1, wherein the photoresist features are exposed to reaction-initiating energy having a variable intensity.

25. The process according to claim 1, further comprising:
exposing the photoresist features to pressure below atmospheric pressure.

26. The process according to claim 25, wherein pressure is substantially a vacuum.

27. The process according to claim 1, further comprising:
exposing the photoresist features to a non-oxidizing atmosphere.

28. The process according to claim 1, wherein the at least one compound is selected from the group consisting of epoxies, epoxides, vinyl ethers, furans, coumarins, indenes, styrenes, acrylonitriles, acrylates, alkynes, alkenes, cyclic ethers, and sulfur dioxide.

29. The process according to claim 1, wherein the at least one compound comprises vinyl monomers.

30. The process according to claim 29, wherein the at least one compound comprises vinyl ether monomers.

31. The process according to claim 29, wherein the vinyl monomers include aromatic groups.

32. The process according to claim 29, wherein the vinyl monomers include at least one member selected from the group consisting of indene, 2,3-benzofuran, phenyl vinyl ether, methyl vinyl ether, and 2,3-dihydrofuran.

33. The process according to claim 29, wherein the vinyl monomers are highly volatile or gaseous.

34. The process according to claim 29, wherein the vinyl monomers are highly volatile or gaseous and include at least one member selected from the group consisting of methyl vinyl ether and 2,3-dihydrofuran.

35. The process according to claim 1, wherein the at least one compound comprises epoxy-functional monomers.

36. The process according to claim 35, wherein the epoxy-functional monomers are selected from the group consisting of (2,3-epoxypropyl)benzene, ethylene oxide, and propylene oxide.

37. The process according to claim 35, wherein the epoxy-functional monomers are highly volatile or gaseous.

38. The process according to claim 1, wherein reaction of the at least one compound with itself causes the photoresist to swell to a size greater than that of its original feature.

39. The process according to claim 38, wherein the photoresist features swell in at least one of at least one direction parallel to a surface that the photoresist is deposited on and a direction perpendicular to the surface that the photoresist is deposited on.

40. The process according to claim 38, wherein the photoresist features swell in at least one direction parallel to a surface that the photoresist is deposited on, thereby resulting in a shrinking of spaces adjacent the photoresist features.

41. The process according to claim 40, wherein the swelling of the photoresist features results in the shrinking of vias surrounded by the photoresist features.

42. The process according to claim 1, wherein the reaction-initiating energy includes at least one form of energy selected from the group consisting of ultraviolet radiation, e-beam, and ion bombardment.

43. A process for forming a semiconductor device structure, the method comprising:
depositing a layer of photoresist on a semiconductor substrate;
exposing a pattern of features in the photoresist;
developing the photoresist features;
exposing the developed photoresist features to a photostabilization process;
exposing the developed photoresist features to at least one compound that will react with itself, the reaction taking place in the presence of at least one component of the photoresist; and
exposing the developed photoresist features to reaction-initiating energy during at least one of prior to, simultaneous with and subsequent to exposing the photoresist features to the at least one compound.

44. The process according to claim 43, wherein the reaction-initiating energy includes at least one form of energy selected from the group consisting of ultraviolet radiation, e-beam, and ion bombardment.

* * * * *